(12) United States Patent
Li et al.

(10) Patent No.: US 11,482,051 B2
(45) Date of Patent: Oct. 25, 2022

(54) DISPLAY APPARATUS AND PATTERN IDENTIFICATION METHOD THEREOF

(71) Applicant: BOE TECHNOLOGY GROUP CO., LTD., Beijing (CN)

(72) Inventors: Changfeng Li, Beijing (CN); Xue Dong, Beijing (CN); Haisheng Wang, Beijing (CN); Yingming Liu, Beijing (CN); Xiaoliang Ding, Beijing (CN); Rui Xu, Beijing (CN); Lei Wang, Beijing (CN); Yunke Qin, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 632 days.

(21) Appl. No.: 16/343,762

(22) PCT Filed: Sep. 3, 2018

(86) PCT No.: PCT/CN2018/103747
§ 371 (c)(1),
(2) Date: Apr. 20, 2019

(87) PCT Pub. No.: WO2019/080652
PCT Pub. Date: May 2, 2019

(65) Prior Publication Data
US 2021/0326618 A1  Oct. 21, 2021

(30) Foreign Application Priority Data
Oct. 27, 2017 (CN) .......................... 201711030024.1

(51) Int. Cl.
*G06K 9/00* (2022.01)
*G06F 3/041* (2006.01)
(Continued)

(52) U.S. Cl.
CPC .......... *G06V 40/67* (2022.01); *G06F 3/04164* (2019.05); *G06V 40/1318* (2022.01);
(Continued)

(58) Field of Classification Search
CPC ...... G06F 3/0412; G06F 3/0421; G02F 21/32; G02F 1/13338; G02F 1/13318;
(Continued)

(56) References Cited

U.S. PATENT DOCUMENTS

| 9,589,170 B2 | 3/2017 | Ling |
| 2012/0013817 A1* | 1/2012 | Kim ...................... G02F 1/1393 349/41 |

(Continued)

FOREIGN PATENT DOCUMENTS

| CN | 103353683 A | 10/2013 |
| CN | 106409209 A | 2/2017 |

(Continued)

OTHER PUBLICATIONS

CN 2nd Office Action in Application No. 201711030024.1, dated Nov. 19, 2020.
(Continued)

*Primary Examiner* — Dong Hui Liang
(74) *Attorney, Agent, or Firm* — Syncoda LLC; Feng Ma (57) ABSTRACT

A display panel includes a substrate, an organic light-emitting layer disposed over the substrate and having at least one pixel, and at least one optical sensor disposed over the substrate distal from the organic light-emitting layer; wherein the at least one pixel is configured to display an image and as a light source for the at least one optical sensor to realize pattern identification.

16 Claims, 8 Drawing Sheets

(51) Int. Cl.
  *H01L 27/32* (2006.01)
  *H01L 51/52* (2006.01)
  *G06V 40/60* (2022.01)
  *G06V 40/13* (2022.01)

(52) U.S. Cl.
  CPC ........ *H01L 27/322* (2013.01); *H01L 27/3234* (2013.01); *H01L 27/3276* (2013.01); *H01L 51/524* (2013.01); *G06F 3/0412* (2013.01); *G06F 2203/04101* (2013.01)

(58) Field of Classification Search
  CPC ... G09G 2300/0426; G09G 2300/3225; G09G 2300/3233; G09G 2354/00
  USPC .......................................... 345/156, 170–178
  See application file for complete search history.

(56) References Cited

U.S. PATENT DOCUMENTS

| | | | |
|---|---|---|---|
| 2015/0036065 | A1 | 2/2015 | Yousefpor et al. |
| 2017/0147865 | A1 | 5/2017 | Jensen et al. |
| 2017/0372113 | A1* | 12/2017 | Zhang ................. H01L 27/3244 |
| 2018/0005006 | A1* | 1/2018 | Chai .................. G06V 40/1318 |
| 2018/0005007 | A1* | 1/2018 | Du ....................... G09G 3/3225 |
| 2018/0033835 | A1* | 2/2018 | Zeng ................. G06V 40/1318 |
| 2018/0306640 | A1* | 10/2018 | Pang .................... G01J 1/0233 |
| 2019/0102594 | A1* | 4/2019 | Peng ................. G06K 9/00087 |
| 2020/0097698 | A1* | 3/2020 | Seo .................... G06K 9/00013 |
| 2020/0285345 | A1* | 9/2020 | Xiang ................ G06K 9/00046 |
| 2021/0103714 | A1* | 4/2021 | Li ........................ G06K 9/0004 |
| 2021/0193748 | A1* | 6/2021 | Kong .................. H04N 5/2257 |

FOREIGN PATENT DOCUMENTS

| | | | |
|---|---|---|---|
| WO | 2014205940 | A1 | 12/2014 |
| WO | 2016205832 | A1 | 12/2016 |
| WO | WO-2019215192 | A1 * | 11/2019 ........... G06K 9/0004 |

OTHER PUBLICATIONS

International Search Report and Written Opinion in the international application No. PCT/CN2018/103747 dated Dec. 4, 2018.
1st Office Action in CN201711030024.1 dated Mar. 18, 2020.

* cited by examiner

DISPLAY APPARATUS AND PATTERN IDENTIFICATION METHOD THEREOF

CROSS-REFERENCES TO RELATED APPLICATION

The present application claims priority to Chinese Patent Application No. 201711030024.1 filed on Oct. 27, 2017, the disclosure of which is hereby incorporated by reference in its entirety.

TECHNICAL FIELD

The present disclosure relates generally to the field of display technologies, and more specifically to a display apparatus and pattern identification method thereof.

BACKGROUND

Many display devices, such as TV sets, mobile phones, laptop computers, and tablet computers, etc., employ a capacitive fingerprint identification method for securely turning on, unlocking or logging into the devices. Fingerprint identification technologies can take advantage of the facts that biometric features such as fingerprints are generally unique and invariable, and thus can have good security and high reliability. However, it is known to users that it can become troublesome to unlock a device when the finger is wet or dirty. In addition, the press keys of the display devices that adopt the area-type capacitive fingerprint identification method can be easily damaged.

SUMMARY

Various embodiments of the present disclosure provide an apparatus and pattern identification method.

In an aspect, a display panel is provided including a substrate; an organic light-emitting layer disposed over the substrate and having at least one pixel; and at least one optical sensor disposed over the substrate distal from the organic light-emitting layer; wherein the at least one pixel is configured to display an image and as a light source for the at least one optical sensor to realize pattern identification.

In some embodiments, the at least one pixel is configured to emit light forming at least one light point.

In some embodiments, the at least one pixel is configured to emit light forming a plurality of light points.

In some embodiments, the plurality of light points are evenly spaced.

In some embodiments, a radiation area of each light point covers at least one adjacent light point.

In some embodiments, the radiation area of each light point has a circular shape; and an adjacent light point is located at a center of a side of an inscribed square of the circular shape or at a corner of the inscribed square.

In some embodiments, each light point comprises at least one pixel of the light-emitting layer of the display panel that is turned on.

In some embodiments, each light point comprises a plurality of pixels of the light-emitting layer of the display panel that are turned on.

In some embodiments, the plurality of pixels are neighboring pixels.

In some embodiments, a distance between the light-emitting layer of the display panel and the pattern to be identified is d; a distance between the at least one optical sensor and the pattern to be identified is t; and an amplification factor of the pattern to be identified by the light point is (d+t)/d.

In some embodiments, d is in a range of approximately 0.5-1.5 mm; and t is in a range of approximately 0.55-2 mm.

In some embodiments, the display panel further includes: an array substrate including a plurality of thin-film transistors (TFTs); wherein the organic light-emitting layer is disposed over a first surface of the array substrate; a color film substrate disposed over a surface of the organic light-emitting layer that is distal from the array substrate; and a color filter layer disposed over a surface of the color film substrate that is distal from the array substrate, and including a color filter and a black matrix.

In some embodiments, the display panel further includes data lines power lines disposed between the organic-light emitting layer and the at least one optical sensor in a direction of projection of the display panel.

In some embodiments, the pattern includes at least one of a fingerprint, a palmprint, or a facial pattern.

In some embodiments, the display panel is part of a smart phone, a tablet computer, or a smart TV.

In some embodiments, each light point emits light with an exit angle in a range of approximately 30°-60°.

In some embodiments, the display panel further includes a plurality of data lines and power lines disposed in layers along a projection direction of the display panel such that orthographic projections of the power lines and the data lines over the sensor array are overlapped, to thereby reduce light-blocking areas.

In some embodiments, the plurality of light points are configured to be turned on in a time-division sequence.

In some embodiments, the display panel further includes: a cover glass disposed over a surface of the color filter layer that is distal from the array substrate.

In some embodiments, each light point emits light with an exit angle of approximately 50°.

In another aspect, a fingerprint identification method of the display panel is provided including: displaying the image on the display panel; illuminating the pattern to be identified with a portion or all of the displayed image; measuring electrical currents generated by the at least one optical sensor from light reflected by the pattern to be identified; and constructing an instant pattern based on the measured electrical currents.

In some embodiments, the method further includes: comparing the instant pattern to a preset pattern; if there is a match, controlling the display panel to conduct a first preset operation; and if there is a mismatch, controlling the display panel to conduct a second preset operation.

In some embodiments, the first preset operation includes unlocking a screen, an application, or a payment confirmation; and the second preset operation includes displaying a prompt message to a user indicating the mismatch.

In some embodiments, the illuminating comprises turning on a plurality of light points in a time-division sequence.

In some embodiments, the illuminating comprises amplifying pattern to be identified by a factor of (d+t)/d; a distance between the light-emitting layer of the display panel and the pattern to be identified is d; and a distance between the sensor array and the pattern to be identified is t.

In some embodiments, displayed image is also for a user's viewing in addition to realize the illuminating.

Other embodiments may become apparent in view of the following descriptions and the attached drawings.

BRIEF DESCRIPTION OF THE DRAWINGS

To more clearly illustrate some of the embodiments, the following is a brief description of the drawings. The draw

DETAILED DESCRIPTION

In the following, with reference to the drawings of various embodiments disclosed herein, the technical solutions of the embodiments of the disclosure will be described in a clear and fully understandable way. It is noted that the described embodiments are merely some but not all of the embodiments of the disclosure. Based on the described embodiments of the disclosure, and that those ordinarily skilled in the art can obtain other embodiment(s), which come(s) within the scope sought for protection by the disclosure.

Capacitive fingerprint identification can become difficult if the finger is wet or contaminated, and the identification area of the device can be easily damaged, and can have degraded sensitivity over time. Although optical fingerprint identification technologies may have advantages over capacitive fingerprint identification technologies, the inventors of the present disclosure have recognized that dedicated light sources may be needed for an optical fingerprint identification module, resulting in more complex structures, larger device areas, and the sensitivity of fingerprint identification being dependent on lighting from the dedicated light sources.

Therefore, according to some embodiments of the present disclosure, a specific display image of the display panel can be employed as the light source of the optical fingerprint sensor. As a result, the structure of the display apparatus can be simplified. Thinner and more miniaturized of the display apparatuses can also be realized. Full-screen fingerprint identification can be achieved, in addition to achieving a higher sensitivity, and a lower cost.

Figure 1:
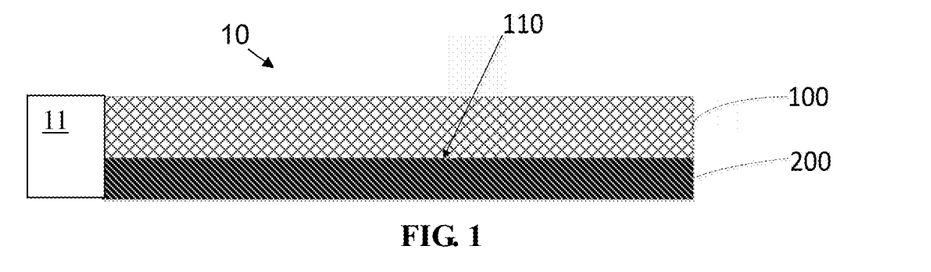
- FIG. 1 is a structural diagram of a display apparatus according to some embodiments of the present disclosure.

For example, according to some embodiments of the present disclosure, with reference to FIG. 1, a display apparatus 10 is provided including a display panel 100, and a sensor array 200 configured to identify a pattern.

Although an organic light-emitting diode (OLED) display is employed as an example to describe various embodiments of the present disclosure, those of ordinary skill in the art will recognize that the inventive features of embodiments the present disclosure can be applied to be included in other types of displays, such as semiconductor LED displays, quantum dot (QD) LED (QLED) displays, etc.

In addition, although an optical sensor array is employed as an example to describe various embodiments of the present disclosure, those of ordinary skill in the art will recognize that it is not limited to visible light. Rather, other types of radiation such as infrared (IR) light may be used so long as it produces satisfactory pattern recognition.

Moreover, the pattern recognition is not limited to fingerprint recognition, which is employed merely as an example to describe some inventive aspects of the present disclosure. Rather, other patterns can also be recognized using the inventive aspects according to various embodiments of the present disclosure.

Specifically, the pattern can be that of biometric features, such as a fingerprint, a palm print, facial features, etc. The pattern can also include non-biometric features, such as a key or a key card. In the following, fingerprint identification is employed as an example to describe the pattern identification process, and it is frequently referred to a user swiping a finger over the display apparatus for the fingerprint pattern to be positively identified by the display apparatus.

However, those of ordinary skill in the art will recognize that the pattern identification methods and devices according to various embodiments can be used to identify other biometric or non-biometric patterns. For example, a user can place a palm over a display surface of a display apparatus and be positively identified. In another example, a user can approach the display surface with the user's face and be positively and securely identified through facial features such as depth patterns.

In some embodiments, the optical fingerprint sensor array 200 is disposed at a back surface 110 of the OLED display panel 100, while a front side surface of the OLED display panel 100 faces the user and is configured to be touched or approached by a pattern for identification.

A controller 11 can also be included in the display apparatus 10, and coupled to the OLED display panel 100 and the optical fingerprint sensor array 200. The controller can be configured to control the fingerprint identification operations.

In the embodiments as illustrated in FIG. 1, a specific image displayed on the OLED display panel 100 can be employed as the light source of the optical fingerprint sensor array 200. A separate or dedicated light source is therefore not necessary for the optical fingerprint sensor array 200, resulting in reduced space requirement for the display apparatus 10, less power consumption, and reduced cost.

The overall structure of the display apparatus 10 can therefore also be effectively simplified, facilitating reduced thickness and miniaturization of the display apparatus 10. Because the whole display panel 100 or essentially any areas of the screen can act as light sources, full-screen pattern identification can be achieved by employing the embodiments of the present disclosure. For example, the user can swipe a finger anywhere on the screen to unlock the display apparatus 10, so long as the image being displayed on the screen provide sufficient lighting to illuminate part or all of the fingerprint at the location being swiped.

In another example, the user can approach his or her face to the screen (such as that of a smart phone or a smart TV), so long as the image being displayed on the screen provide sufficient lighting to illuminate part or all of the facial features at the area of the screen being approached, the display apparatus 10 can be unlocked if the facial pattern is positively identified.

According to some embodiments of the present disclosure, the back surface of the display panel 100 refers to the surface distal from the users when they view the display panel 100, and the front surface of the display panel 100 refers to the surface proximal to the users when they view the display panel 100. In some other embodiments, other orientations or directions can be defined differently, as the "front" and "back" can be just relative terms.

In some embodiments of the present disclosure, the specific display image on the display panel 100 employed as the light source can be any image(s) displayed on the display panel 100 so long as it can satisfy the requirements of sufficient lighting for the fingerprint sensor array 200 to successfully identify the fingerprint. Those of ordinary skill in the art can recognize that such a specific display image can be selected according to practical needs so long as it provides sufficient light as the light source for the fingerprint identification operations.

For example, in some embodiments, the specific display image is displayed on the display panel 100 only in a region where the finger touches or comes within a predetermined distance to the front surface of the display panel, and other regions of the display panel 100 do not necessarily display this specific image. In some implementations, such a display image may simply be a bright spot on the screen to be touched or approached.

In some other embodiments, the specific display image can be on the full screen of the display panel 100. This may be easier to operate and implement and does not have to interfere with regular displaying activities on the display panel 100, so long as the display image can effectively provide sufficient brightness for accurately identify fingerprints.

According to some embodiments of the present disclosure, there are no limitations to specific pictures or patterns of the specific display image acting as the light source for pattern identification, so long as the emitted light associated with the specific pictures or patterns is sufficient for the pattern identification purposes.

For example, the specific display image can form an area light source, a line light source, a point light source, or other regular or irregular-shaped light sources.

In some embodiments of the present disclosure, in order to improve an amplification factor of the fingerprint and increase the sensitivity and accuracy of fingerprint identification, the specific display image can form a point light source. For example, the specific display image can comprise at least one light point. The light point can be employed as the point light source, which can enlarge the fingerprint image, and improve the amplification factor of the fingerprint.

The enlarged image can be projected onto the optical fingerprint sensor array 200, generating photocurrents depending on the different intensities of the light reflected by ridges and valleys of the fingerprint. As the optical sensor array 200 produces photocurrents of different strengths, information about the ridges and valleys of the fingerprint can be obtained, thereby realizing the fingerprint identification function. The point light source according to some embodiments can effectively improve the sensitivity of fingerprint identification.

In some embodiments of the present disclosure, there are no limitations to the number of the light points in the specific display image acting as the point light source. So long as it can satisfy the requirements for the brightness and clarity of fingerprint identification, those of ordinary skill in the art can select the number of the light points according to practical needs.

Each light point can include one display pixel of the display panel 100 according to some embodiments. As such, even though referred to as a "point," the light point can have a finite size similar to that of a typical display pixel, such as on the orders of nanometers, micrometers, millimeters, etc. In some embodiments, a light point can include more than one pixel, such as two pixels, three pixels, four pixels, etc., and still be referred to as a light "point." In some implementations, the multiple pixels of the light point are neighboring pixels clustered together.

Figure 2A:
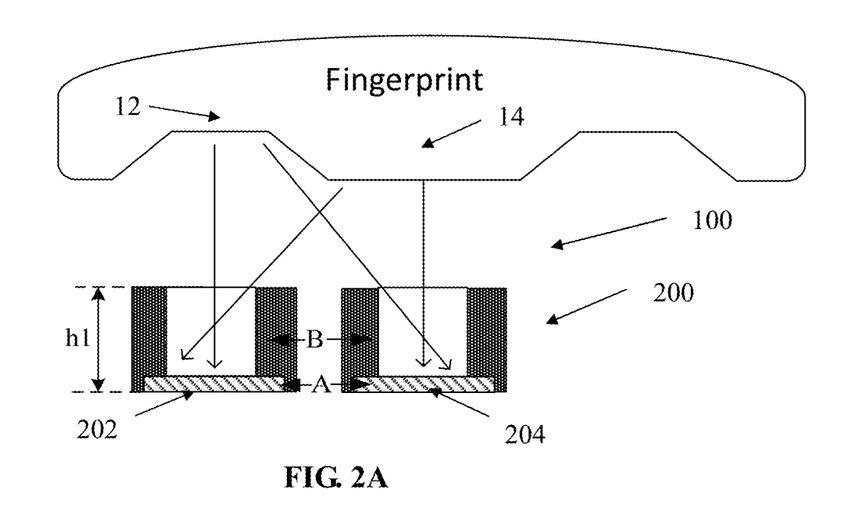
FIG. 2A is a schematic diagram of light reflected at a certain position of a finger being received by two optical sensors.

As illustrated in FIG. 2A, when a finger approaches or touches a front surface of the display panel 100, a valley 12 of the fingerprint has a first distance from an optical sensor element 202 directly below the valley 12 of the fingerprint; a ridge 14 of the fingerprint has a second distance from an optical sensor element 204 directly below the ridge 14 of the fingerprint; and the first distance is greater than the second distance.

Similarly, a palmprint or a face also has its unique patterns of valleys and ridges, and can be employed for an identification process similar to the fingerprint identification process. As such, even though "fingerprint identification" is referred to below in various embodiments, it is merely by way of example and not limiting. Various embodiments disclosed herein can be applied to identification of other types of patterns as well.

In some embodiments, the optical sensor array 200 includes a light-guiding layer B having a thickness of h1, and an optical sensor layer A. A light transmission distance of the light reflected by the valley 12 through a light-guiding layer B to the optical sensor element 202 of the optical sensor layer A is relatively long, the light intensity is lower, and the electrical current corresponding to the electrical signal generated by the optical sensor element 202 of the optical sensor layer A is therefore smaller.

On the other hand, a light transmission distance of the light reflected by the ridge 14 through the light-guiding layer B to the optical sensor element 204 of the optical sensor layer A is shorter, the light intensity is higher, and the electrical current corresponding to the electrical signal generated by the optical sensor element 204 of the optical sensor A is larger.

Based on this principle, the valleys 12 or ridges 14 (e.g., patterns) of the fingerprint can be identified by detecting electrical current amplitudes corresponding to the electrical signals generated by optical sensor elements 202, 204, . . . , of the optical sensor layer A.

Figure 2B:
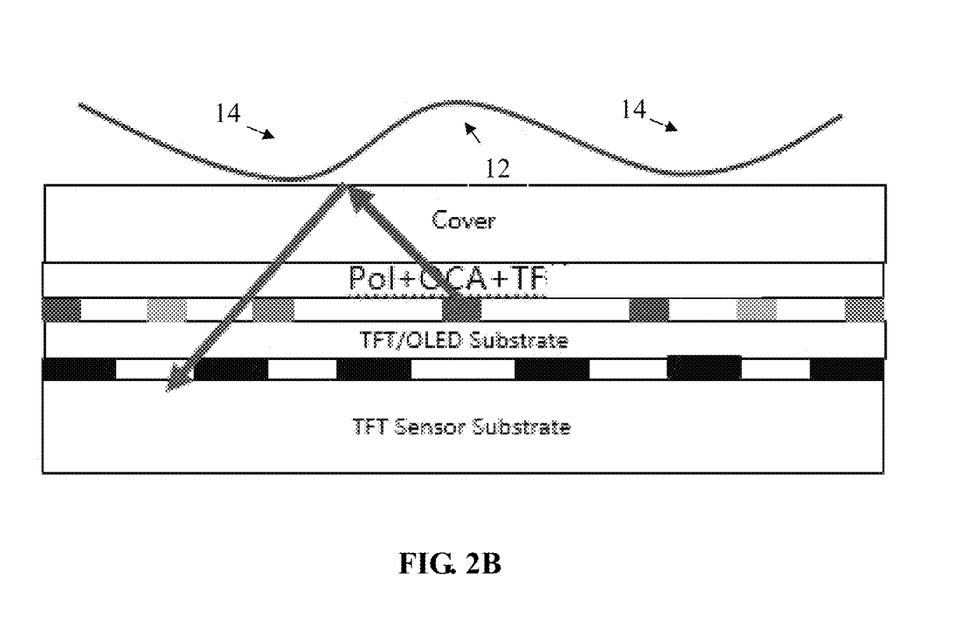
FIG. 2B is a structure diagram of a display panel interacting with a fingerprint according to some embodiments.

FIG. 2B illustrates a display panel interacting with a pattern having valleys 12 and ridges 14 according to some embodiments. The display panel includes, for example, a TFT sensor substrate, a sensor array disposed over the TFT sensor substrate, a TFT/OLED substrate layer, a light-emitting layer including pixels of different colors disposed over the TFT/OLED substrate layer, a polarizer/optically clear adhesive (OCA)/thin film (TF) layer disposed over the light-emitting layer, and a cover disposed over the polarizer/OCF/TF layer configured to be touched or approached by the pattern to be recognized. The TFT/OLED substrate layer can also include a plurality of TFTs forming an array substrate for the organic light-emitting layer.

Figure 2C:
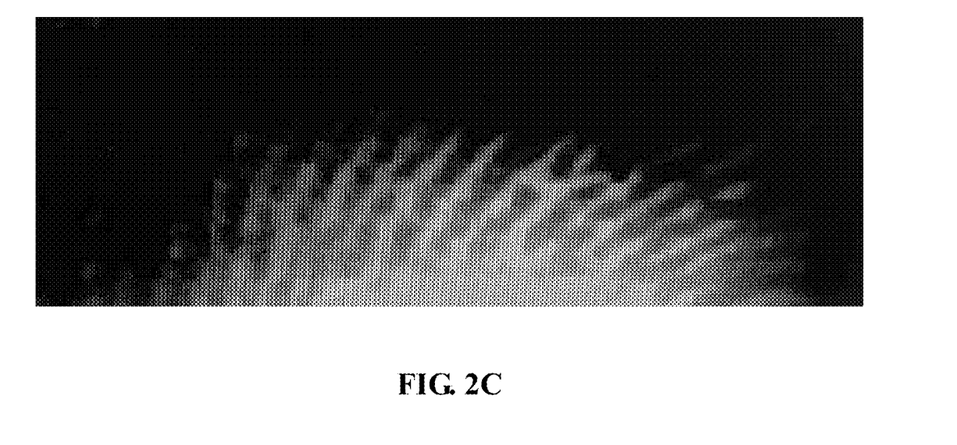
FIG. 2C illustrates a portion of a fingerprint pattern obtained when there is only one point light source according to some embodiments of the present disclosure.
Figure 3:
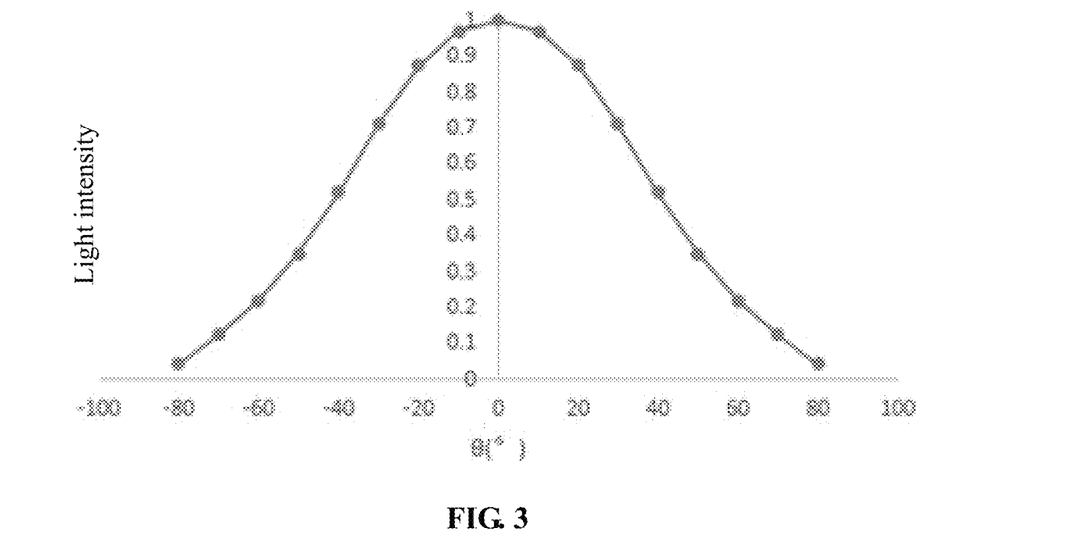
FIG. 3 is a light intensity distribution diagram of the light emitted by the point light source from various exit angles according to some embodiments of the present disclosure.
Figure 4:
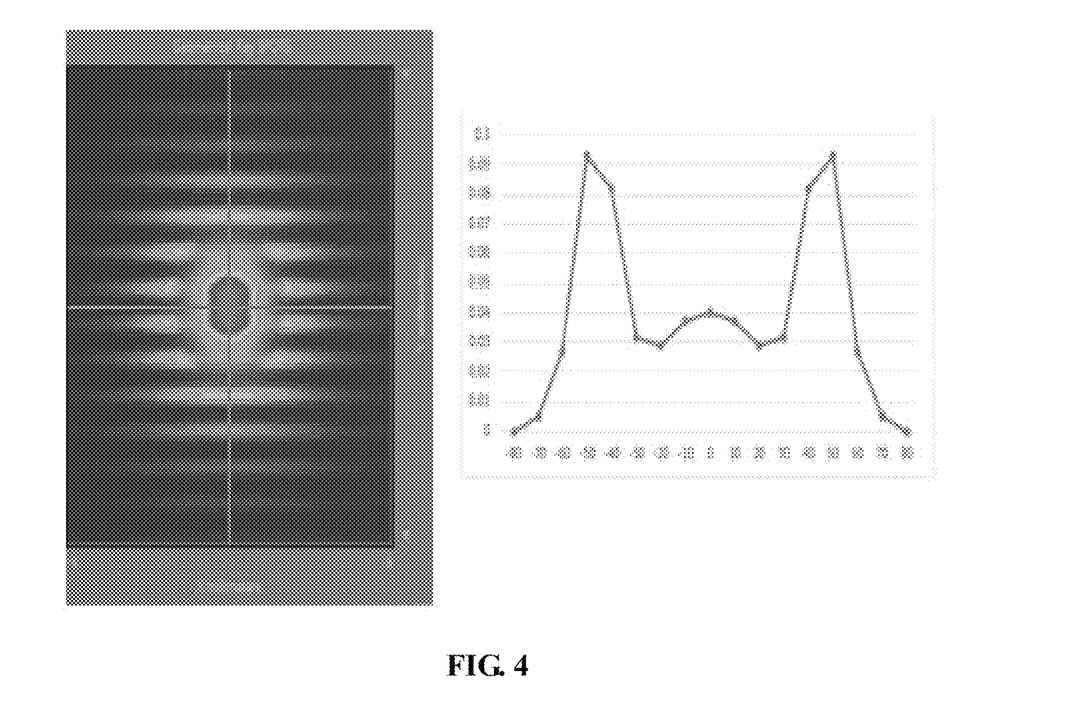
FIG. 4 is a schematic diagram of a relationship between a reflection ratio of the light at an interface of the fingerprint valley and a light exit angle according to some embodiments of the present disclosure.
Figure 5:
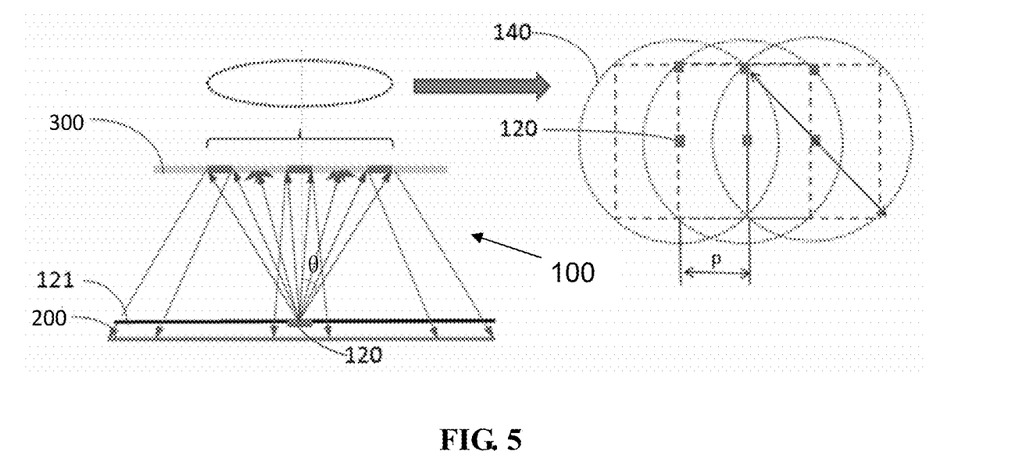
FIG. 5 is a schematic diagram of a distribution of point light sources according to some embodiments of the present disclosure.

With reference to FIG. 2C, FIG. 3, and FIG. 4, reflection contrast of the ridges and valleys of the fingerprint for the light emitted by the point source can change according to changes in the exit angle of the light. For example, experimentation by the inventors demonstrates that the reflection contrast of the ridges and valleys of the fingerprint for the light emitted by the point-light source is very strong when the exit angle ($\theta$ as illustrated in FIG. 5) is in a range of approximately 30°-60°. As a result, the effect of fingerprint identification is improved in these situations.

Therefore, according to some embodiments of the present disclosure, when one or more point-light sources are employed for the fingerprint identification function, the reflected light of the point source is selected to have an exit angle in the range of 30-60°. In some embodiments, each light point emits light with an exit angle of approximately 50°.

Therefore, in some embodiments of the present disclosure, to effectively utilize the light for fingerprint identification, the specific display image includes a plurality of light points having predetermined space(s) therebetween. The plurality of the light points can enhance the brightness of the lighting condition, effectively utilizing light from the plurality of light points, thereby improving the sensitivity and accuracy of the fingerprint identification.

In some embodiments of the present disclosure, for fingerprint identification employing a plurality of light points as the light source, a time-division lighting can be implemented. For example, in some embodiments, the plurality of light points light up sequentially, such as one at a time. In some other embodiments, the plurality of light points each light up according to a predetermined sequence, such as by programming the controller to turn on each light point at a predetermined time. In some implementations, only one light point is turned on at a given time. In some other implementations, multiple light points can be turned on at a given time.

It is noted that the terms used herein, such as "light up" or "turned on," do not necessarily mean that one or more pixels constituting the light points are in the "ON" state as against "OFF" state. Rather, the terms can refer to the one or more pixels constituting the light points having their brightness increased to a predetermined threshold value, i.e., the pixels can possibly be all in an "ON" state but having different brightness while forming the picture or pattern of the specific display image. In some embodiments, the brightness of the pixels can be adjusted individually to thereby change the brightness of the one or more light points. In some other embodiments, the brightness of the one or more light points can be adjusted by adjusting the number of pixels that are "ON."

By utilizing time-division lighting according to some embodiments, the effective light from each light point can be better utilized without interference from other light. As such, a substantially clearer partial fingerprint pattern can be obtained for each time division, and a substantially clearer full fingerprint pattern can be obtained after overlaying the partial fingerprint patterns obtained at different time divisions. As a result, accuracy for fingerprint identification can be greatly improved, resulting in better performance of the display apparatus 10 with the fingerprint identification function.

In some embodiments of the present disclosure, in order to further improve the fingerprint identification, different distributions of the light points can be provided. One such an example of the distributions is illustrated in FIG. 5, where an array of three light points 120 are shown to have a distance p therebetween. There are no limitations to the distance p between two light points 120, so long as it can achieve desired or optimal reflection contrast of the fingerprint ridges and valleys. Those of ordinary skill in the art will recognize that, so long as effective or optimal fingerprint identification is achieved, the distance p can be selected according to practical needs such as device size.

In some embodiments of the present disclosure, with reference to FIG. 5, the radiation region 140 of each light point 120 covers the adjacent light point. As a result, light from the plurality of light points can be utilized effectively, for example to a substantially full extent, to form the fingerprint pattern, thereby improving the clarity and accuracy of fingerprint identification.

According to some embodiments of the present disclosure, there are no limitations to the shape of the radiation region 140 of the light points, so long as the radiation region 140 of each light point covers the adjacent light point(s) and can effectively utilize the range of radiation angles of the point light source. Those of ordinary skill in the art can select the shapes of the radiation region 140 according to practical needs. The shapes of the radiation regions or the cones of light can have regular shapes according to some embodiments, or irregular shapes according to some other embodiments.

According to some embodiments of the present disclosure, there are no limitations to the configurations of the light points, as long as the desired illumination and identification of the fingerprint can be achieved. Those of ordinary skill in the art will also recognize that the configuration or distribution of the light points can be selected according to practical needs, such as the geometrical parameters of the display apparatus 10.

In some embodiments of the present disclosure, with reference to FIG. 5, the radiation area 140 of each light point 120 can be circular, and the adjacent light point is located at a center of a right-side of the inscribed square of the circle 140. As a result, the light can be utilized to obtain an improved reflection contrast of the fingerprint ridges and valleys to form the fingerprint pattern. Full-screen fingerprint identification on the display apparatus 10 can be achieved with improved clarity, sensitivity, and accuracy.

In some embodiments of the present disclosure, there are no limitations to the specific method for forming the light points, so long as the requirements for fingerprint identification can be satisfied. Those of ordinary skill in the art will recognize that how each individual light point is formed can be selected according to practical needs.

For example, according to some embodiments of the present disclosure, each light point includes at least one display pixel that is turned "ON" or have a brightness above a predetermined threshold value. As a result, existing structures of a display apparatus can be employed to provide pixels as light sources for fingerprint identification. The structure and manufacturing process of the display apparatus 10 can therefore be simplified, with a higher degree of integration, thereby facilitating thinner, more miniaturized, lower cost, and more energy efficient display apparatus.

In some embodiments of the present disclosure, each light point comprises a plurality of adjacent pixels that are turned "ON" or have a brightness above a predetermined threshold value. As a result, the brightness of the light point formed by a plurality of pixels can be higher that the configuration of each light point having only one pixel. The plurality of pixel units being adjacent to one another or sufficiently clustered together still allows a point light source to be effectively formed. The sensitivity and clarity of fingerprint identification can also be improved significantly by selecting optimal configuration of the multiple pixels forming individual light points.

In some embodiments of the present disclosure, there are no limitations to the color(s) of the light emitted by the pixels of the light sources, so long as fingerprint identification can be satisfactorily achieved. Those of ordinary skill in the art will recognize that the color(s) of the light emitted by the pixels can be selected according to specific needs, such as utilizing the displayed pictures or patterns already for the user's viewing. For example, the light can be red light, green light, blue light, or any other monochromatic light or polychromatic light. The testing results in FIG. 2C, FIG. 3, and FIG. 4 are results obtained through testing with green light, for example.

The light emitted by the pixels of the light sources can be dedicated light for illuminating the fingerprint according to some embodiments, or can be part of displayed images or patterns on the display panel 100 according to some other embodiments, so long as the light is sufficient for the fingerprint identification function.

Figure 6:
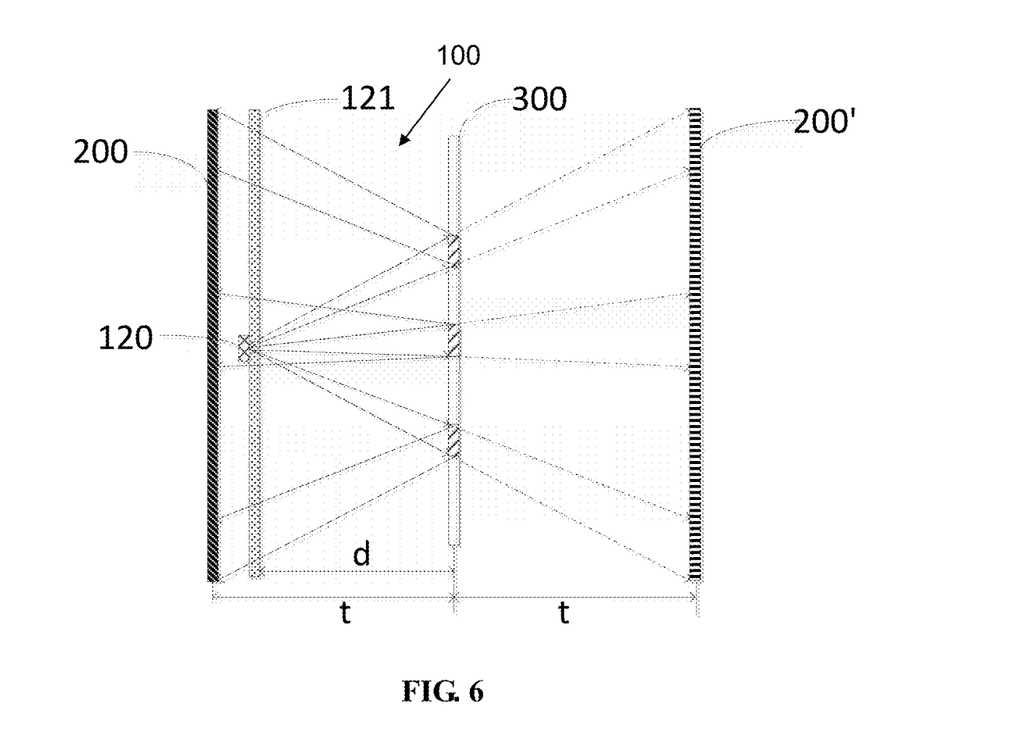
FIG. 6 illustrates working principles of fingerprint identification according to some embodiments of the present disclosure.

In some embodiments of the present disclosure, with reference to FIG. 6, a distance d between a light-emitting layer 121 having the pixels and a front side where a fingerprint 300 touches or approaches the display panel 100 is in a range of about 0.5-1.5 mm. In some embodiments, the front side of the display panel 100 has a front cover made of glass, plastic, or other substantially transparent materials, which the fingerprint 300 comes into contact with for fingerprint identification. In some other embodiments, the fingerprint 300 does not need to be in contact with the front cover, but rather can be identified at a sufficiently short range within a threshold distance.

A distance t between an optical fingerprint sensor array 200 and the fingerprint 300 for identification is in a range of about 0.55-2 mm. A mirror image 200' of the optical fingerprint sensor array 220 also has a distance t to the fingerprint 300. Based on the geometrical relationship, an amplification factor of fingerprint identification is about (d+t)/d. Therefore, the amplification factor of fingerprint is effectively increased, improving the sensitivity and accuracy of fingerprint identification.

According to some other embodiments, the point light source is not necessarily from the display pixels of the display panel, or part of an image displayed on the display panel to be viewed by the user for other purposes in addition to functioning as the light source; rather, the point light source can also be an external light source, or a separate/dedicated light source such as a micro-LED device integrated in the OLED display panel.

According to some embodiments of the present disclosure, the light reflected by the fingerprint will pass through various film layers in the display panel 100, such as an array substrate and the polarizer. When passing through these structures, intensity of the light reflected by the fingerprint can be greatly reduced. In order to obtain better fingerprint identification, the structure of the display panel can be optimized to improve light transmission, and thereby the sensitivity and accuracy of fingerprint identification.

Figure 7A:
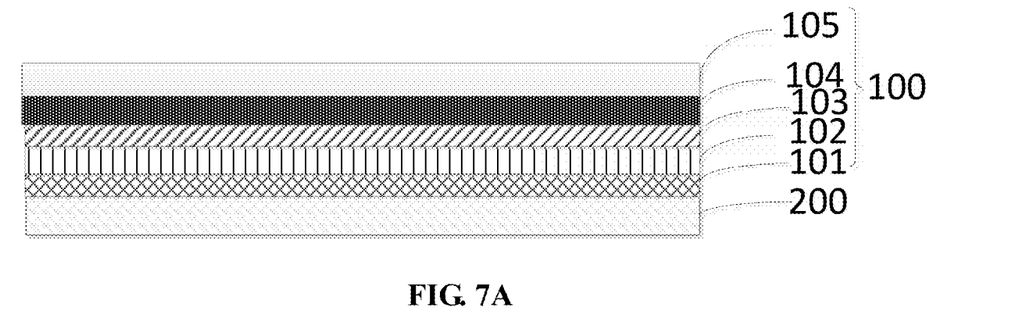
FIG. 7A is a structural diagram of the display apparatus according to some embodiments of the present disclosure.

In some embodiments of the present disclosure, with reference to FIG. 7A, the display panel 100 includes an array substrate 101, and an OLED light-emitting assembly 102 disposed over a first surface of an array substrate 101. A color film substrate 103 is disposed over a surface of the OLED light-emitting assembly 102 that is distal from the array substrate 101. A color filter (CF) layer 104 is disposed over a surface of the color film substrate 103 that is distal from the array substrate 101.

The color filter layer 104 can include a color filter and a black matrix. A cover glass 105 can be disposed over a surface of the color filter layer 104 that is distal from the array substrate 101. Such a display panel structure is more simplified and easier to implement compared with existing technologies.

Figure 7B:
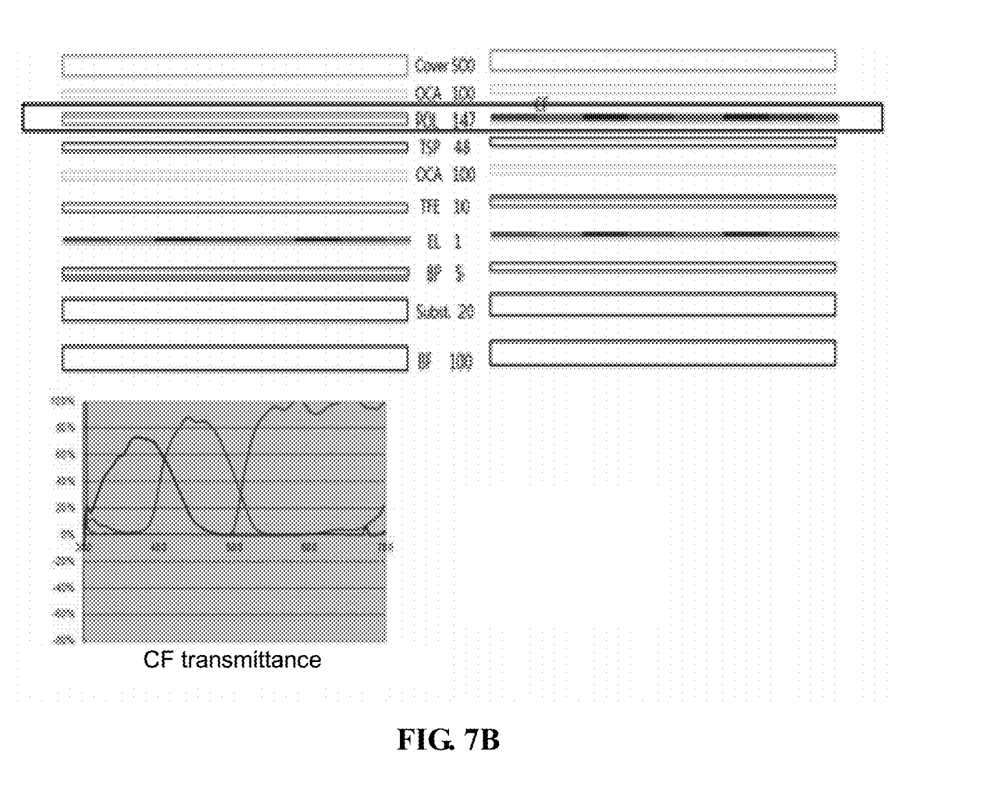
FIG. 7B is a diagram illustrating a comparison of structures and light transmittances between two configurations having a polarizing layer and a color filter layer, respectively.

Replacing of the polarizer in existing technologies with the color filter layer 104 also greatly improves the transmittance of the light reflected by the fingerprint, thereby improving the sensitivity and accuracy of fingerprint identification. FIG. 7B is a diagram illustrating a comparison of structures and light transmittances between two configurations having a polarizing layer and a color filter layer, respectively. The upper left panel of FIG. 7B illustrates a display panel structure including, from bottom up, a buffer film (BF), a substrate, a BP layer, an electroluminescent layer (EL; also referred to as the light-emitting layer) including red, green, and blue pixels, a thin-film encapsulation (TFE) layer, and optically-clear adhesive (OCA) layer, a TSB layer, a polarization layer, another OCA layer, and a cover layer.

The upper right panel of FIG. 7B illustrates a display panel structure including a CF layer replacing the polarization layer in the structure of the upper right panel. The lower left panel of FIG. 7B shows that the light transmittance of the CF layer for blue light is over 70% at its peak, over 80% for green light at its peak, and close to 100% for red light. By replacing the polarization layer with the CF layer, the overall light transmittance is increased from about 45% to about 70-90%.

Figure 8A:
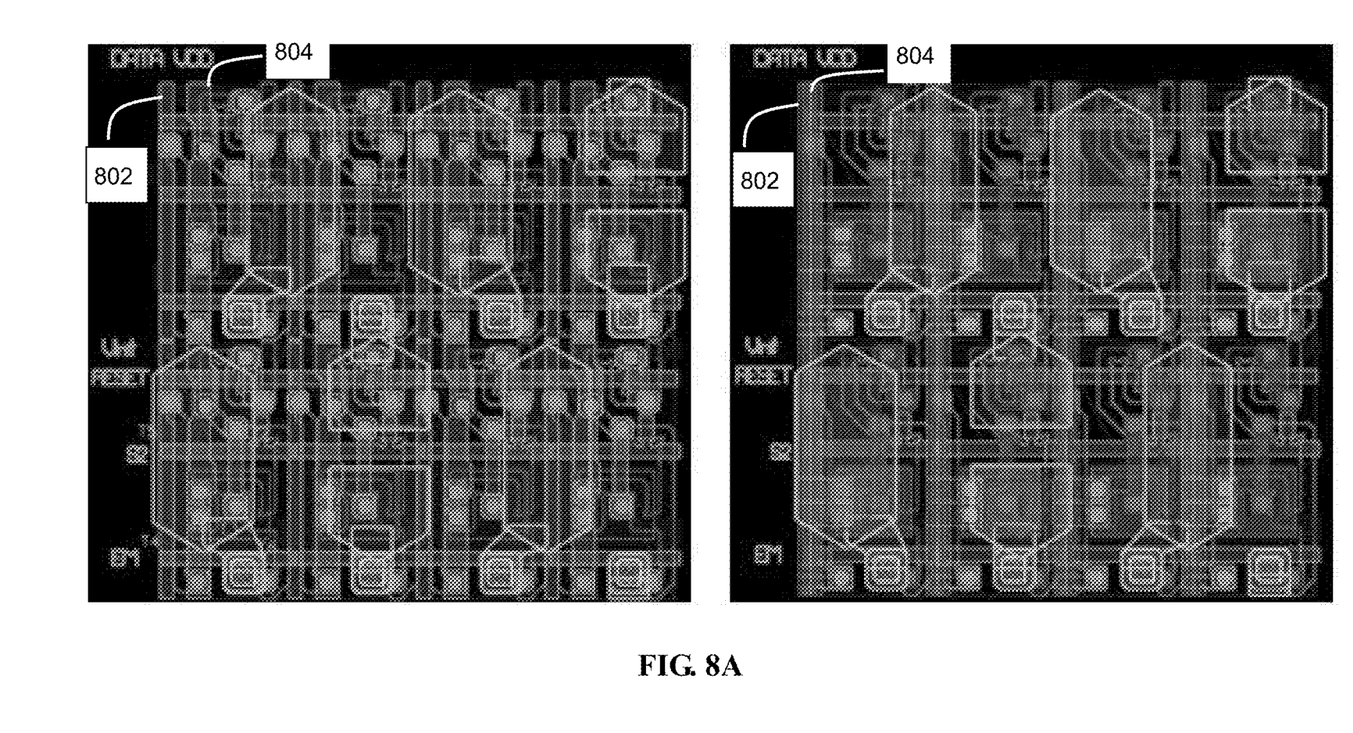
FIG. 8A is a schematic diagram of electrical circuitry of the fingerprint sensor array according to some embodiments of the present disclosure.

In some embodiments of the present disclosure, in order to further increase the transparent area for light output, data lines and power lines in the display panel 100 are disposed in layers along a direction of thickness of the display panel 100, as illustrated in FIG. 8A.

FIG. 8A is a schematic diagram of electrical circuitry of the fingerprint sensor array according to some embodiments of the present disclosure. As shown in the right-side panel of FIG. 8A, data lines 802 (DATA) and power lines 804 (VDD) are substantially overlapped in the plan view.

Compared with technologies where data lines 802 (DATA) and power lines 804 (VDD) are configured in parallel over the display panel as illustrated in the left-side panel of FIG. 8A, according to some embodiments disclosed herein, orthographic projections of the power lines and the data lines over the optical fingerprint sensor array 200 are overlapped, thereby reducing the light-blocking area from areas of two lines to areas of one line. The transparent area for light output is therefore effectively increased, and the sensitivity and accuracy of fingerprint identification are greatly improved.

In an example, a light transmission area is increased from about 12% for the configuration of parallel data lines and power lines to about 14.8% for the configuration of overlapped data lines and power lines.

In some embodiments of the present disclosure, the controller is configured to test the electrical currents generated by the fingerprint sensor array 200 and construct an instant fingerprint pattern based on the electrical currents. The instant fingerprint pattern is compared with a preset fingerprint pattern to determine whether there is a match. If so, the display apparatus is controlled to conduct a first operation such as unlocking the screen or applications, payment confirmation, etc. If the instant fingerprint pattern is different from the preset pattern, the display apparatus is controlled to perform a second preset operation such as a prompt message of errors. As such, secure access to the display apparatus is provided.

Figure 8B:
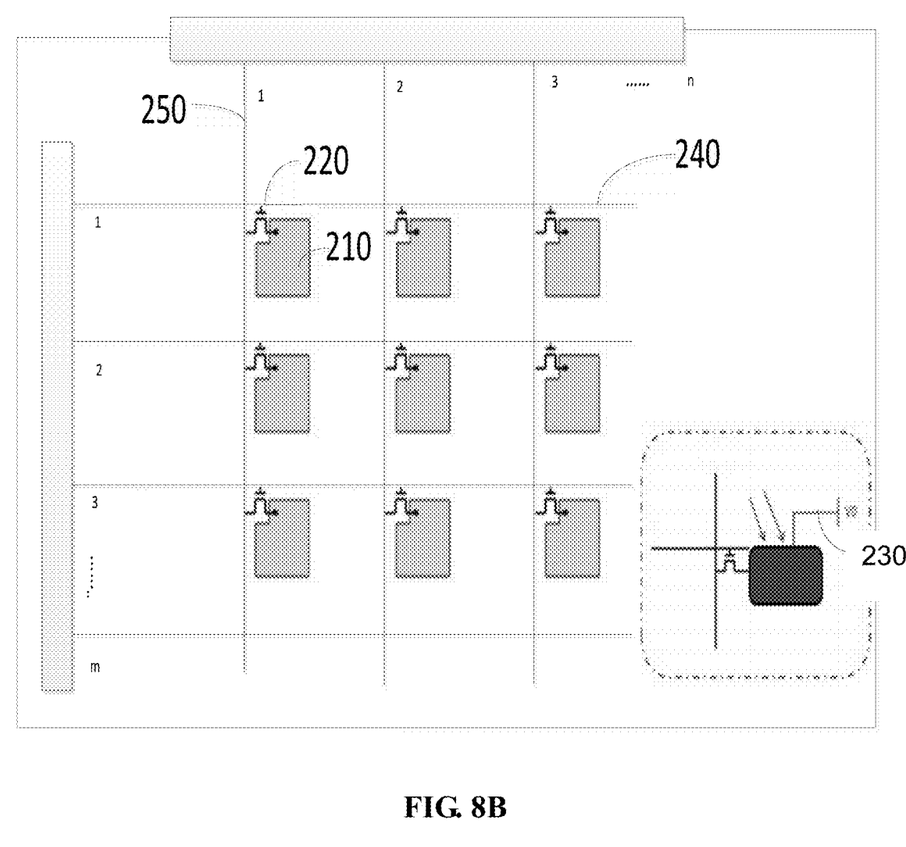
FIG. 8B is a schematic diagram of the fingerprint sensor array according to some embodiments of the present disclosure.

In some embodiments of the present disclosure, the optical fingerprint sensor array can include a plurality of sensors, as illustrated in FIG. 8B. Each sensor can include a photodetector such as a PIN photodiode 210. In some other embodiments, the photodetector can be a complementary metal-oxide-semiconductor (CMOS) sensor, an avalanche photodiode (APD), or any other types of photosensor that can convert light into electrical signals. The material of the photosensitive layer can be or include an organic photoelectric conversion material, or an inorganic photoelectric conversion material, such as a semiconductor material. "ON" and "OFF" of the photodiode 210 of each optical fingerprint sensor can be controlled by a thin film transistor (TFT) 220 through a first electrode of the photodiode 210.

Another electrode 230 of the optical fingerprint sensor 210 can be controlled by a common electrode VO, which can provide a direct current signal with a voltage of about −5~1 V. Each row of scan lines 240 can be turned on to perform a scan according to a preset time sequence. The data lines 250 can read the photocurrent information generated by each row of the PIN photodiodes 210.

For example, when the light reflected by the fingerprint reaches the optical fingerprint sensor array 200, because the intensities of the light reflected by the ridges and valleys of the fingerprint are different, the photocurrents generated by the PIN photodiodes are different. When the TFT 220 is turned on, the data line 250 collects signals of different strengths, thereby realizing the fingerprint identification function.

In another aspect, the present disclosure provides a fingerprint identification method of a display apparatus. In some embodiments, with reference to FIG. 1, the display apparatus includes the OLED display panel 100, and the optical fingerprint sensor array 200 disposed over the first surface of the OLED display panel 100. The display panel 100 can have the structure described above and illustrated in FIG. 7A and FIG. 7B, for example. The controller 11 as illustrated in FIG. 1 can be coupled to the OLED display panel 100 and the optical fingerprint sensor array 200 and configured to control the fingerprint identification operations.

A display image of the OLED display panel 100 can be employed as the light source of the optical fingerprint sensor array 200. According to some embodiments, the specific image displayed on the OLED display panel serves a dual purpose. For example, the image can be a picture as a screensaver, a wallpaper, part of a video, etc., which is for the user to view, whether for informational or entertainment. At the same time, the image serves as the light source for the pattern (e.g., fingerprint) identification, so long as the image can cause satisfactory illumination of the pattern for identification purpose.

In some embodiments, the display apparatus 10 can be in a "sleep" mode with a dark screen, and can display the image when triggered by an event, such as an incoming call, an incoming text message, an alarm clock, a sound input from the user (such as the user verbally calling the display apparatus 10 to "wake" it up), a haptic input from the user (such as the user pressing a button, or part of the screen, as sensed by a capacitive or other type of sensor), a kinetic input from the user (such as the user picking up the display apparatus 10 or shaking the display apparatus 10), a visual input from the user (such as the user approaching the display apparatus 10 with his or her face, palm, finger, etc.), etc.

In some embodiments, the image can be already displayed on the display panel 100, such as part of a video being played on the display panel 100. When the user attempts to access secure information on the display apparatus 10, the user can approach the display panel 100 with a finger, a face, a palm, or other preset patterns to be identified. Without interfering the user's viewing of the video being played, the displayed image illuminates the pattern to be identified and the display apparatus 10 performs the pattern identification operation. If there is a match, the display apparatus 10 gives the user access to the secure information, such as files or communication channels; if there is no match, the video continues to play on the display panel without interruption. Alternatively, a prompt message can be provided to the user, such as "access denied," etc.

Figure 9:
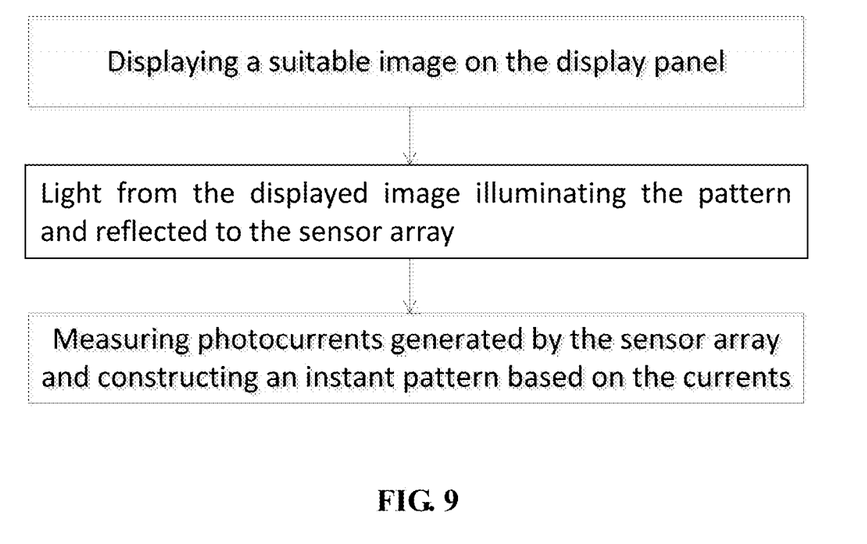
FIG. 9 is a flowchart of the fingerprint identification method of the display apparatus according to some embodiments of the present disclosure.

The fingerprint identification method can include, with reference to FIG. 9, displaying an image on the display panel 100 suitable for illuminating the fingerprint; the light emitted by the specific display image, after being reflected by the fingerprint, reaching the optical fingerprint sensor array 200; detecting the electric currents generated by the optical fingerprint sensor array 200 and constructing instant fingerprint pattern based on the electric currents. By employing the image displayed on the display panel 100 as the light source, the structure of the display apparatus can be effectively simplified, facilitating thinner and more miniaturized of display apparatus, reducing the cost, while achieving full-screen fingerprint identification.

In some embodiments of the present disclosure, the method further includes: comparing the instant fingerprint pattern with the preset fingerprint pattern using the controller; if the instant fingerprint pattern sufficiently matches or is identical to the preset fingerprint pattern, controlling the display apparatus 10 to conduct the first preset operation; if the instant fingerprint pattern is different form the preset fingerprint pattern, controlling the display apparatus 10 to conduct the second preset operation. As a result, information security of the user is protected through the fingerprint identification since human fingerprints are generally unique and invariable. Such a fingerprint identification method can have advantages of good security and high reliability, and therefore can be adopted in various applications to secure personal information, especially in display apparatuses, such as TV sets, mobile phones, laptop computers, and tablet computers, etc.

In some embodiments of the present disclosure, there are no limitations to the specific types of the first preset operation and second preset operation. For example, the first preset operation may be unlocking the screen or applications, or payment confirmation, etc., and the second preset operation may be displaying a prompt message, such as notifying the user that there is a mismatch of the pattern, etc.

In a conventional display apparatus, a separate or dedicated light source needs to be provided to illuminate the fingerprint for the optical fingerprint sensor array to detect the fingerprint pattern, and thus more space and more power are needed to realize the fingerprint identification function.

The sensitivity of fingerprint identification is rather low, and full-screen fingerprint identification is difficult to achieve. In contrast, according to various embodiments of the present disclosure, by utilizing the image displayed on the display panel of the OLED light-emitting assembly as the light source, the fingerprint identification function can be achieved with higher sensitivity and accuracy, reduced space occupied by components of the display apparatus 10, and full-screen fingerprint identification can be achieved, thereby improving competitiveness of the OLED display apparatus.

In an example, a user seeking to be positively identified, for example to turn on or operate the display apparatus 10 can simply swipe a finger in a predetermined area where the fingerprint identification can be performed, and the display apparatus 10 turns on and starts to display content on its display area including the predetermined area where the fingerprint identification can be performed.

In some embodiments, the photosensitive 200 can be disposed throughout the display area of the display apparatus 10, and the full screen of the display apparatus 10 already can act as light sources anywhere on the screen. In this case, fingerprint identification can be achieved anywhere on the display area, such as across a whole screen of the display apparatus.

For example, a user can swipe or touch a finger, a palm, a patterned key card, or approach the apparatus with a face anywhere of the screen, and the apparatus can be turned on or operated as desired, after a positive identification is established. Facial features such as depth profiles also include "valleys" and "ridges" as those described above with respect to a fingerprint, and thus can also be identified with a similar principle. However, because characteristic widths of these "valleys" and "ridges" are larger than those of a fingerprint or a palmprint, the characteristic sizes of the identification regions such as the pitch and density of the identification regions may also need to be changed.

In some other embodiments, the pattern identification function is configured to secure an apparatus other than a display apparatus. For example, the pattern identification function disclosed herein can be part of a lock, a safe, a door, a vehicle, etc.

At least some of the embodiments of the present disclosure can solve one or more technical problems in existing technologies. For example, a display apparatus according to some embodiments of the present disclosure can achieve full-screen fingerprint identification. Thinner, lighter, or smaller apparatuses with simpler structures can also be realized.

The inventors recognized that the structure of the display component is effectively simplified, employing the specific display image of the OLED display panel as the light source of the optical fingerprint sensor array is beneficial for the thinning and miniaturization of the display component, full-screen fingerprint identification can be achieved, and there is no need to provide separate light source for the optical fingerprint sensor array, it takes less space, consumes less power and saves the cost.

Unlike conventional optical fingerprint identification technologies where a separate light source needs to be configured for each optical fingerprint identification module, at least some embodiments disclosed herein can reduce the complexity of the device structure, reducing the device area and the power consumption, by employing LED pixels as one or more light sources. Therefore, thinner and more miniaturized display apparatuses can be realized, and full-screen fingerprint identification can be achieved.

In the present disclosure, it is to be understood that the terms "center," "longitudinal," "transverse," "length," "width," "thickness," "upper," "lower," "front," "back," "left," "right," "vertical," "horizontal," "top," "bottom," "inside," "outside," "clockwise," "counterclockwise," "axial," "radial," "circumferential," "column," "row," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

Moreover, the terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the present disclosure, a first element being "on," "over," or "below" a second element may indicate direct contact between the first and second elements, without contact, or indirect through an intermediate medium, unless otherwise explicitly stated and defined.

Moreover, a first element being "above," "over," or "at an upper surface of" a second element may indicate that the first element is directly above the second element, or merely that the first element is at a level higher than the second element. The first element "below," "underneath," or "at a lower surface of" the second element may indicate that the first element is directly below the second element, or merely that the first element is at a level lower than the second feature. The first and second elements may or may not be in contact with each other.

In the description of the present disclosure, the terms "one embodiment," "some embodiments," "example," "specific example," or "some examples," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described may be combined in a suitable manner in any one or more embodiments or examples. In addition, various embodiments or examples described in the specification, as well as features of various embodiments or examples, may be combined and reorganized.

Implementations of the controller and the operations described in this disclosure can be implemented in digital electronic circuitry, or in computer software, firmware, or hardware, including the structures disclosed herein and their structural equivalents, or in combinations of one or more of them. Implementations of the controller described in this disclosure can be implemented as one or more computer programs, i.e., one or more modules of computer program instructions, encoded on one or more computer storage medium for execution by, or to control the operation of, data processing apparatus.

Alternatively, or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them.

Moreover, while a computer storage medium is not a propagated signal, a computer storage medium can be a source or destination of computer program instructions encoded in an artificially-generated propagated signal. The computer storage medium can also be, or be included in, one or more separate components or media (e.g., multiple CDs, disks, or other storage devices). Accordingly, the computer storage medium may be tangible and non-transitory.

The operations described in this disclosure can be implemented as operations performed by a data processing apparatus on data stored on one or more computer-readable storage devices or received from other sources.

The display apparatus 10 may be a terminal or part of a terminal, which may include all kinds of apparatus, devices, and machines for processing data, including, by way of example, a programmable processor, a computer, a system on a chip, or multiple ones, or combinations of the foregoing.

The devices in this disclosure can include special purpose logic circuitry, e.g., an FPGA (field-programmable gate array), or an ASIC (application-specific integrated circuit). The device can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The devices and execution environment can realize various different computing model infrastructures, such as web services, distributed computing, and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The methods, processes and logic flows described in this disclosure can be performed by one or more programmable processors executing one or more computer programs to perform actions by operating on input data and generating output. The processes and logic flows can also be performed by, and apparatus can also be implemented as, special purpose logic circuitry, e.g., an FPGA, or an ASIC.

Processors suitable for the execution of a computer program include, by way of example, both general and special purpose microprocessors, and any one or more processors of any kind of digital computer. Generally, a processor will receive instructions and data from a read-only memory, or a random-access memory, or both. Elements of a computer can include a processor configured to perform actions in accordance with instructions and one or more memory devices for storing instructions and data.

Generally, a computer will also include, or be operatively coupled to receive data from or transfer data to, or both, one or more mass storage devices for storing data, e.g., magnetic, magneto-optical disks, or optical disks. However, a computer needs not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few.

Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

Other types of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Implementations of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

The features disclosed herein may be implemented as part of a smart home design, which may implement individually or integrally various electronic devices in a home or office. For example, control or display functions described above may be realized on a smart television (or connected television, hybrid television, etc.), which may include a processing circuit configured to integrate Internet connectivity with more traditional television programming sources (e.g., received via cable, satellite, over-the-air, or other signals). The smart television may be physically incorporated into a television set or may include a separate device such as a set-top box, Blu-ray or other digital media player, game console, hotel television system, and other companion devices. A smart television may be configured to allow viewers to search and find videos, movies, photos and other content on the web, on a local cable TV channel, on a satellite TV channel, or stored on a local hard drive.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be utilized.

All references cited in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A display panel, comprising:
   a substrate;
   an organic light-emitting layer disposed over the substrate and having at least one pixel; and
   at least one optical sensor disposed over the substrate distal from the organic light-emitting layer;
   wherein:
   the at least one pixel is configured to display an image and as a light source for the at least one optical sensor to realize pattern identification;
   the at least one pixel is configured to emit light forming a plurality of light points;
   a radiation area of each light point covers at least one adjacent light point;
   the radiation area of each light point has a circular shape; and
   the adjacent light point is located at a center of a side of an inscribed square of the circular shape or at a corner of the inscribed square.

2. The display panel of claim 1, wherein each light point comprises a plurality of pixels of the light-emitting layer of the display panel that are turned on.

3. The display panel of claim 2, wherein the plurality of pixels are neighboring pixels.

4. The display panel of claim 1, wherein:
   a distance between the light-emitting layer of the display panel and the pattern to be identified is d;
   a distance between the at least one optical sensor and the pattern to be identified is t; and
   an amplification factor of the pattern to be identified by the light point is (d+t)/d.

5. The display panel of claim 4, wherein:
   d is in a range of approximately 0.5-1.5 mm; and
   t is in a range of approximately 0.55-2 mm.

6. The display panel of claim 1, further comprising:
   a plurality of thin-film transistors (TFTs) disposed at the substrate forming an array substrate; wherein the organic light-emitting layer is disposed over a first surface of the array substrate;
   a color film substrate disposed over a surface of the organic light-emitting layer that is distal from the array substrate; and
   a color filter layer disposed over a surface of the color film substrate that is distal from the array substrate, and including a color filter and a black matrix.

7. The display panel of claim 6, further comprising:
   a cover glass disposed over a surface of the color filter layer that is distal from the array substrate.

8. The display panel of claim 1, wherein each light point emits light with an exit angle in a range of approximately 30°-60°.

9. The display panel of claim 8, wherein each light point emits light with an exit angle of approximately 50°.

10. The display panel of claim 1, wherein the plurality of light points are evenly spaced.

11. The display panel of claim 1, wherein each light point comprises at least one pixel of the light-emitting layer of the display panel that is turned on.

12. The display panel of claim 1, further comprising data lines power lines disposed between the organic-light emitting layer and the at least one optical sensor in a direction of projection of the display panel.

13. The display panel of claim 1, wherein the pattern comprises at least one of a fingerprint, a palm print, or a facial pattern.

14. The display panel of claim 1, wherein the display panel is part of a smart phone, a tablet computer, or a smart TV.

15. The display panel of claim 1, further comprising a plurality of data lines and power lines disposed in layers along a projection direction of the display panel such that orthographic projections of the power lines and the data lines over the sensor array are overlapped, to thereby reduce light-blocking areas.

16. The display panel of claim 1, wherein the plurality of light points are configured to be turned on in a time-division sequence.

\* \* \* \* \*